(12) United States Patent
Camporese et al.

(10) Patent No.: US 6,460,169 B1
(45) Date of Patent: *Oct. 1, 2002

(54) ROUTING PROGRAM METHOD FOR POSITIONING UNIT PINS IN A HIERARCHICALLY DESIGNED VLSI CHIP

(75) Inventors: Peter J. Camporese, Hopewell Junction; Allan H. Dansky, Poughkeepsie; Howard H. Smith, Beacon, all of NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/422,040

(22) Filed: Oct. 21, 1999

(51) Int. Cl.[7] .............................................. G06F 17/50
(52) U.S. Cl. ......................................... 716/10; 716/13
(58) Field of Search ........................... 716/2, 9, 10, 11, 716/13

(56) References Cited

U.S. PATENT DOCUMENTS

| 5,404,313 A | 4/1995 | Shiohara et al. |
| 5,638,293 A | 6/1997 | Scepanovic et al. |

Primary Examiner—John F. Niebling
Assistant Examiner—Stacy Whitmore
(74) Attorney, Agent, or Firm—Cantor Colburn LLP; Lynn Augspurger

(57) ABSTRACT

A routing program length method for positioning unit pins in a hierarchically designed VLSI chip first identifies unit pin positions initially assigned in a hierarchical VLSI design that, if implemented, would increase the net length of the net of which the unit pins are a part. To identify unit pins, where the unit pin position assigned by the unit designer turns out to be a poor choice of position when the unit is integrated into the top level design, a "flat" file is created of the completed VLSI design with the units positioned on the chip, including their pin placements as assigned by the unit designers. The flat file includes not only top level unit data and unit-to-unit net data, but also macro data and macro net data integral to each unit design. The flat design data file is used to generate two pin logs; one pin log includes the Incremental lengths of each net including the incremental lengths associated with the unit pins (if any) assigned by the designers of the units. The other pin log is the same, except it does not include the unit pins and the incremental net length associated with the unit pins. A commercially available program, for example, a Minimum Spanning Tree (MST) program or a Steiner Minimal Tree program is run against every net; once against the nets in the pin log list that includes the pins assigned by the designers of the units, and once against the nets in the pin log list that does not include assigned unit pins. The output of interest of the MST (or similar program) run against the net files with and without pin assignments is a text file containing the net names, number of pins per net with and without unit pins and the difference between the net lengths with and without unit pin assignments. If the difference exceeds a threshold value a router program is run

11 Claims, 10 Drawing Sheets

ROUTING PROGRAM METHOD FOR POSITIONING UNIT PINS IN A HIERARCHICALLY DESIGNED VLSI CHIP in isolation against each net without unit pins. Pins are placed where the wiring route for the net crosses each unit boundary.

FIELD OF THE INVENTION

This invention relates to improvements in hierarchical design methods for VLSI chips, and more particularly to a method to identify, in a hierarchically designed chip, those nets with unit pins located in a sub-optimal position.

TRADEMARKS

S/390 and IBM are registered trademarks of International Business Machines Corporation, Armonk, N.Y., U.S.A. and Lotus is a registered trademark of its subsidiary Lotus Development Corporation, an independent subsidiary of International Business Machines Corporation, Armonk, N.Y. Other names may be registered trademarks or product names of International Business Machines Corporation or other companies.

BACKGROUND

VLSI chips have and continue to grow in complexity due to increasing levels of integration and increasing performance requirements. The time required for a design development cycle for such chips typically increases as the complexity increases. One prior art method used for managing the design complexity and to decrease the design development cycle time is to break down the design into a hierarchical set of components which can be designed concurrently. The physical design methodology to support the hierarchical, concurrent development of components typically employs abstract representations of the lower level (children) components during the design of the higher level (parent) components. This abstraction is required to support concurrent development since the goal is to allow a parent component to be implemented at the same time that its children components are being implemented. The initial abstraction of the children components serves as place holders during the implementation of the parent and contains all required design detail for the parent implementation. One of these details is the positions of terminals (or pins) which serve as connection points to complete physically wired nets which traverse the parent and child hierarchies.

A disadvantage in the hierarchical, concurrent methodology is that the designer of each child (i.e. unit) does not "see" the other children or the parent (top level). Also the top level designer does not "see" the detailed content of each unit but only the abstracted representation. This lack of knowledge of the whole design can lead to sub-optimization or waste. The location of pins at each hierarchical boundary (i.e. unit boundary) may not be optimal, and if not, can increase considerably the length of a net.

SUMMARY OF THE INVENTION

An object of the invention is to provide a method of determining whether or not unit pin placements in the initial design provide minimal net lengths.

Another object of the invention is to identify any sub-optimal initial pin locations so that the pin locations can be optimized, while preserving the benefits of a hierarchical, concurrent physical design implementation. Briefly, this invention contemplates the provision of a method for identifying unit pin positions initially assigned in a hierarchical VLSI design that, if implemented, would increase the net length of the net of which the unit pins are a part. To identify unit pins, where the unit pin position assigned by the unit designer turns out to be a poor choice of position when the unit is integrated into the top level design, a "flat" file is created of the completed VLSI design with the units positioned on the chip, including their pin placements as assigned by the unit designers. The flat file includes not only top level unit data and unit-to-unit net data, but also macro data and macro net data integral to each unit design. Such macro data is not typically used in combination with the top level data, hence the need to create a flat file to bring internal unit data and top level data together with a common nomenclature and a common coordinate description of unit and macro locations. The input for this flat design data file contains unit and macro net names, unit and macro pins assigned to each net, macro and unit physical data including pin shapes, wiring blockage shape data, and unit and macro placement data. The flat design data file is used to generate two pin logs; one pin log includes the incremental lengths of each net including the incremental lengths associated with the unit pins (if any) assigned by the designers of the units. The other pin log is the same, except it does not include the unit pins and the incremental net length associated with the unit pins. The data in each pin log lists, for each of the nets in the VLSI chip design, component and instant names, placement locations (including rotation attributes), pin names, and chip (top level translated) x,y coordinates for the shape rectangles that comprise the unit pins. A commercially available program, for example, a Minimum Spanning Tree (MST) program or a Steiner Minimal Tree program is run against every net; once against the nets in the pin log list that includes the pins assigned by the designers of the units, and once against the nets in the pin log list that does not include assigned unit pins. For convenience, the MST or similar program is run against all nets, but only the difference values for nets that leave the units (i.e. have unit pins) are non-zero. The output of interest of the MST (or similar program) run against the net files with and without pin assignments is a text file containing the net names, number of pins per net with and without unit pins and the difference between the net lengths with and without unit pin assignments. If the difference exceeds a threshold value, that net is identified so that the unit pins can be reassigned by the unit designer or designers. In one embodiment, the designer determines by inspection of the net, in isolation, where to relocate the unit pins. In another embodiment, an MST program is run against each sub-optimum net, in isolation, without unit pins. The point where the "as the crow files line" of the MST program crosses the unit boundaries provides an optimum pin location, although such location may not be precisely physically realizable due to a blockage or crowding of another unit pin. In yet another embodiment, a router program is run in isolation against each net without unit pins. Pins are placed where the wiring route for the net crosses each unit boundary.

BRIEF DESCRIPTION OF THE DRAWINGS

The foregoing and other features and advantages of the invention will be better understood from the following detailed description of a preferred embodiment of the invention, in which.

DETAILED DESCRIPTION OF THE INVENTION

Figure 1:
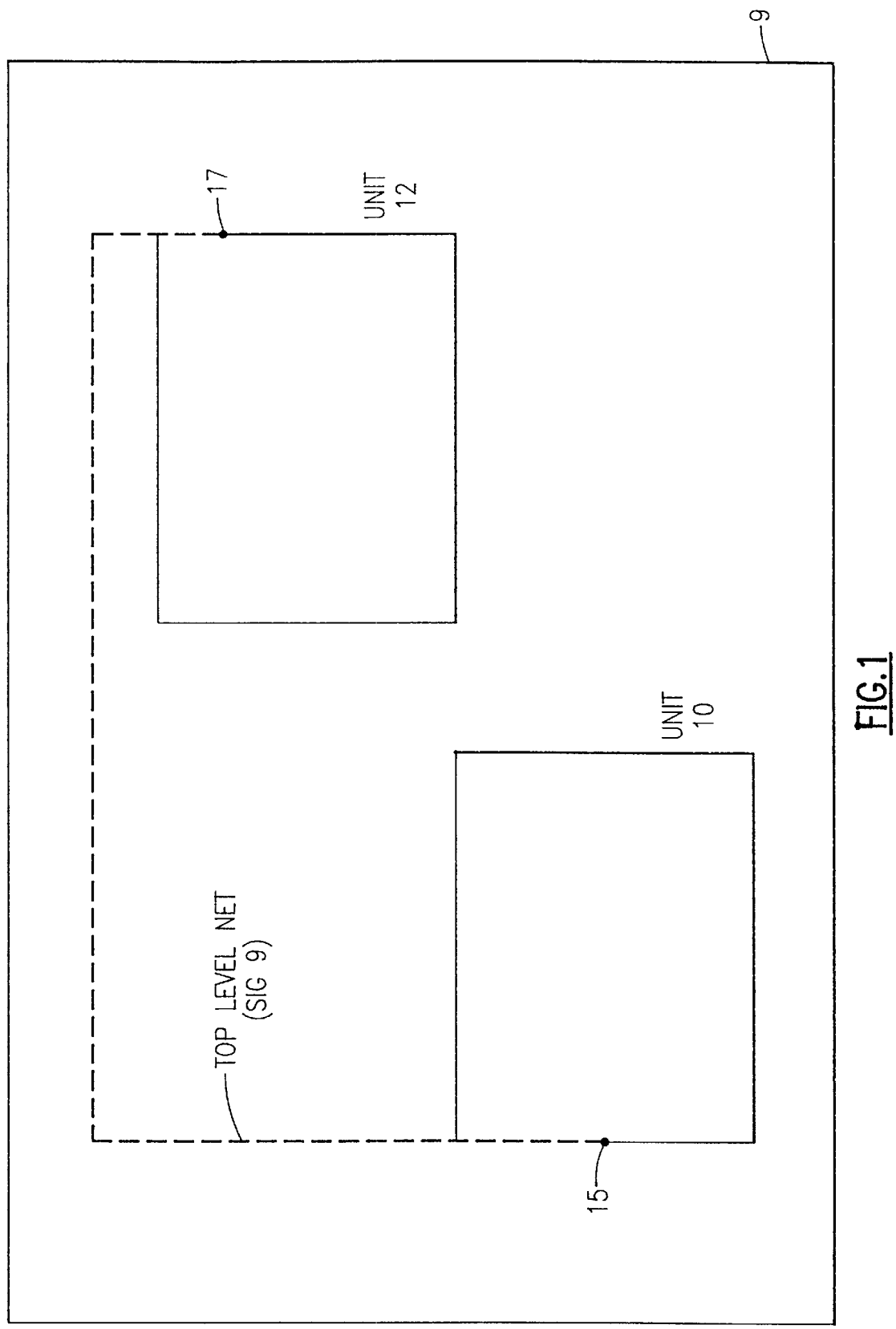
FIG. 1 is a fragmentary, top, plan view illustration of a VLSI chip showing the placement of two units, with unit designer initially proposed unit pin placements for connecting a net between the two units.
Figure 2:
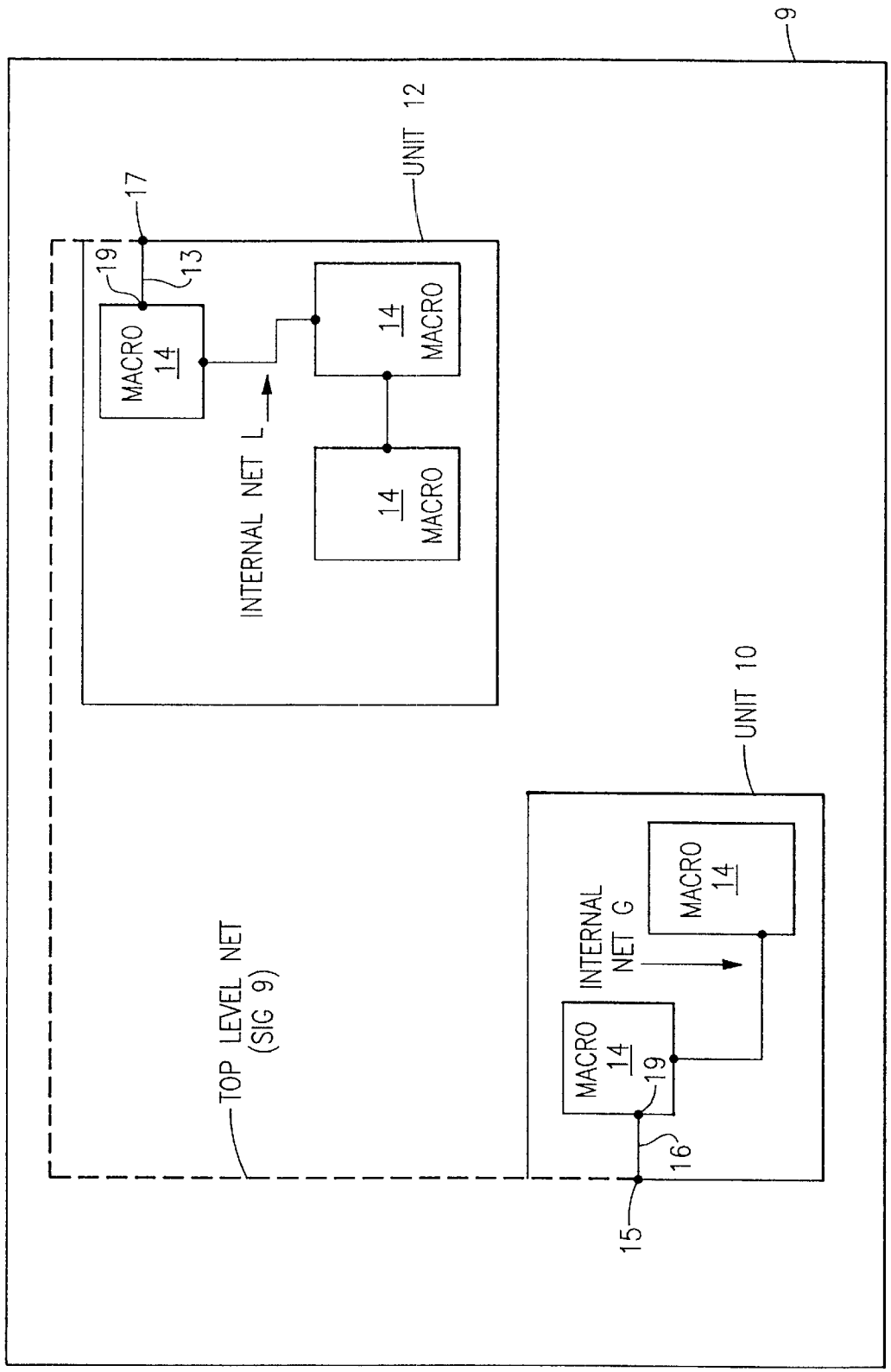
FIGS. 2, 3 and 4 are replications of FIG. 1 showing respectively various illustrative details that could be shown in a single figure but are shown here in separate figures for the purpose of visual clarity.

Referring now to FIGS. 1–2, they pictorially represent a fragment of the top level design layout of two units 10 and 12 (e.g. a register unit, a memory unit, an ALU, etc.) which are to be incorporated in a VLSI chip 9. As will be appreciated by those skilled in the art, the fragmentary, pictorial views are greatly simplified as compared with an actual VLSI design. FIG. 1 shows the top level design placement of units 10 and 12, with unit pins 15 and 17 that are to be connected together into an external net (e.g. SIG 9). FIG. 1 represents the information typically available to the top level designer and, it will be further appreciated by those skilled in the art, this information is insufficient to determine whether or not pins 15 and 17 are optimally placed.

Referring to FIG. 2, each unit is comprised of macros 14, various combinations of which are interconnected as internal net 16 within a unit, for example nets G and L. Some (but not all) of these internal nets (13 and 16) are connected to nets in other units; nets interconnected between units are referred to as external nets. An external net typically comprises an internal net 16 in one unit (e.g. 10) that connects a macro pin 19 to a unit pin 15 at the periphery of the unit, and the internal net 13 in another unit 12 that connects a macro pin 19 in the other unit to unit pin 17 at the periphery of the other unit. Each unit designer decides where to place the unit pins for his or her units. The top level designer determines the unit placement at the top level. The unit pin placement for an external net may result in an unnecessary increase in overall external net length, as is apparent from an inspection of FIG. 2 although not from FIG. 1. Those skilled in the art will also appreciate that the drawings and explanation in this application are greatly simplified for the purpose of clarity and ease of understanding but obscure the actual complexity of the problem; a typical VLSI chip has on the order of fifty thousand internal nets and ten thousand external nets.

Since the overall VLSI chip design (top level) and the respective units that go into the overall design are designed by different designers, an initial step, in the process of identifying external nets with excessive net lengths due to non-optimum external pin placements, is to create a "flat" computer file that includes external nets along with the internal nets that are a part of the external nets. In a specific embodiment of the invention, the so-called flat file contains all the internal nets as a matter of convenience in generating the relevant data from the individual unit data files and the top level data file, even though only unit nets that form a portion of an external net are of interest with respect to unnecessary net length.

Figure 7:
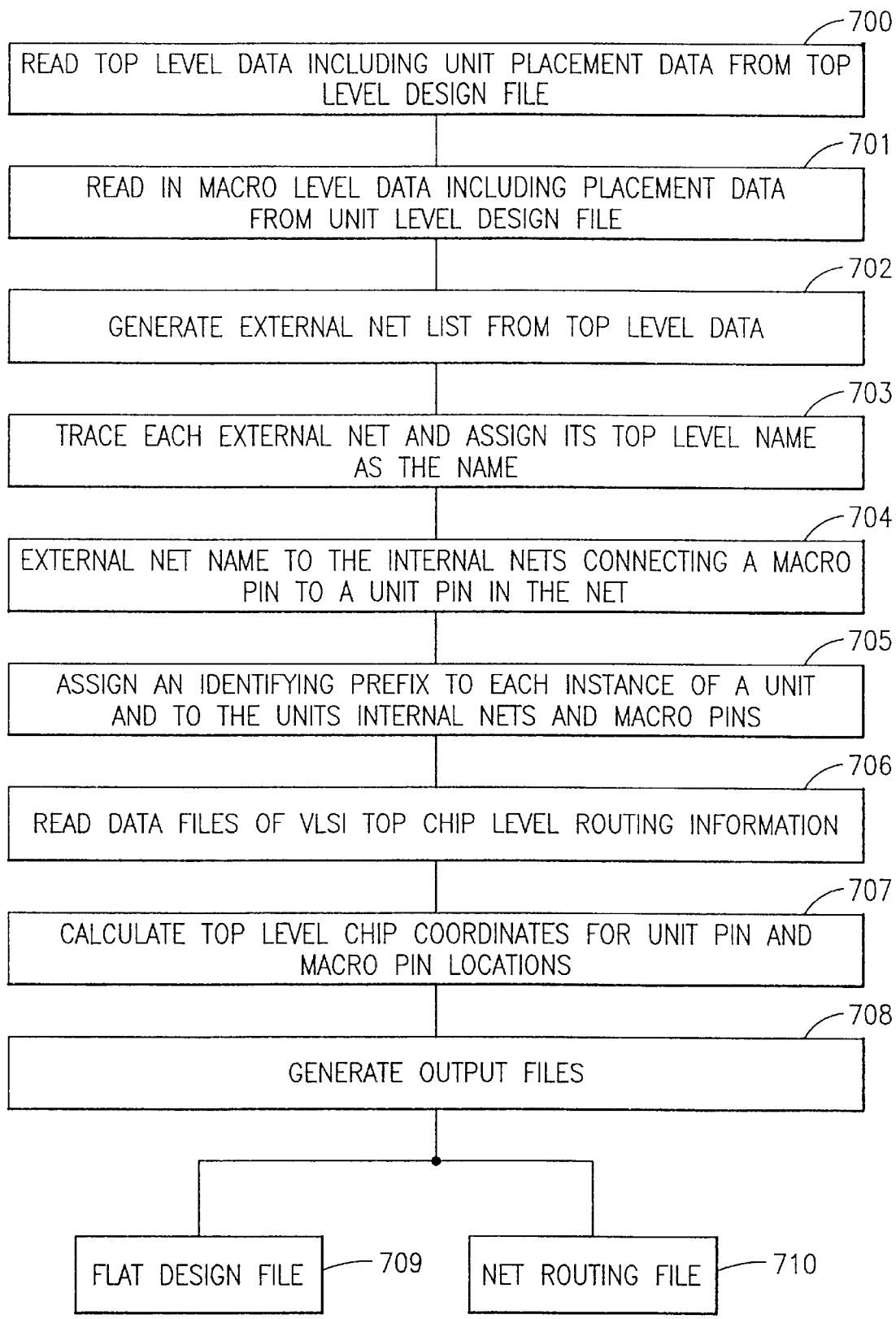
FIG. 7 is a flow diagram of process steps to create a flat file as an initial step to identify unit pins that are placed in the initial unit design in locations that increase the length of the net of which the pin is a part.

FIG. 7 is a flow diagram of program steps to generate the flat file, i.e. a file of unit data and top level data with the unit data modified so that it is compatible with the top level data. The flat file program uses, as one data input set, the unit design data, and as another data input set, the top level VLSI design data, which includes unit placement data on the chip. At block 700 the program reads the top level VLSI chip data, including unit placement data, and at 701 it reads the individual unit data, including macro placement data. As graphically illustrated in FIG. 3, the unit placement data includes the coordinates (x,y) of a reference point 29 on each unit relative to a reference point 21 on the chip 9. The macro placement data includes the coordinates (x',y') of the macro pins within the units, which are referenced to point 29 on each unit. As will be appreciated by those skilled in the art, often the same unit design is used more than once in a VLSI chip design. Often one such unit's orientation at the top level is rotated with respect to, or a mirror image of, another. The program advantageously includes a routine to account for the orientation of the unit in translating macro coordinates to top level chip coordinates.

At 702 the program reads the top level net records (i.e. list of unit pins connected to each external net; e.g. pins 15 and 17).

Figure 4:
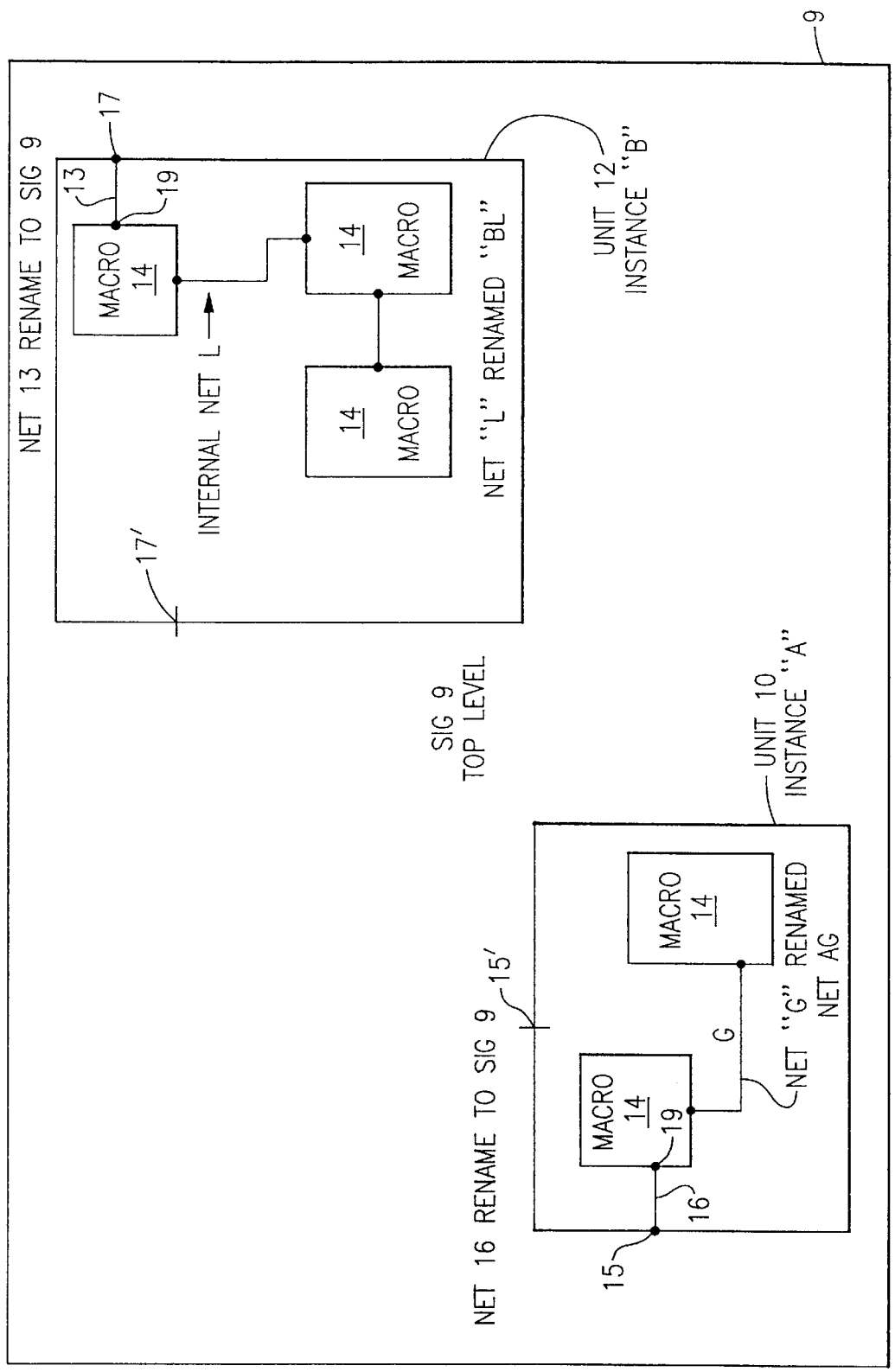

Next at, block 703, the program traces each chip level net (i.e. an external net that leaves a unit). Each external net has a top level name (e.g. SIG 9) that has been assigned to it by the top level designer. The nets 13 and 16, which are part of an external net, have internal net names that have been assigned by the unit designers. At 704 the program renames these nets 13 and 16 with the external net name, hence SIG 9, as illustrated in FIG. 4. As will be appreciated by those skilled in the art, any unit may be used more than one time in the VLSI chip. Therefore, each time the same unit is used (i.e. an instance of the unit) the program assigns (705) an instance name to the unit as a prefix and assigns this unit instance name as a prefix to each internal net of the unit. For example, in FIG. 4, the instance name of unit 10 is A. The internal net named G is therefore renamed AG. Similarly, net "L" in unit 12 is renamed "BL", where unit 12's instance name is B. Macro pin names are also prefixed with the unit instance name.

Next in block 706, the program reads the data files providing the VLSI top chip level design routing information which is used by the routing program for routing the top level interconnections and power. This routing information includes routing blockages (i.e. contract blockages), via descriptions, class rules, clearance rules, pin shapes, technology data, and other data necessary for running a minimum routing program.

Figure 3:
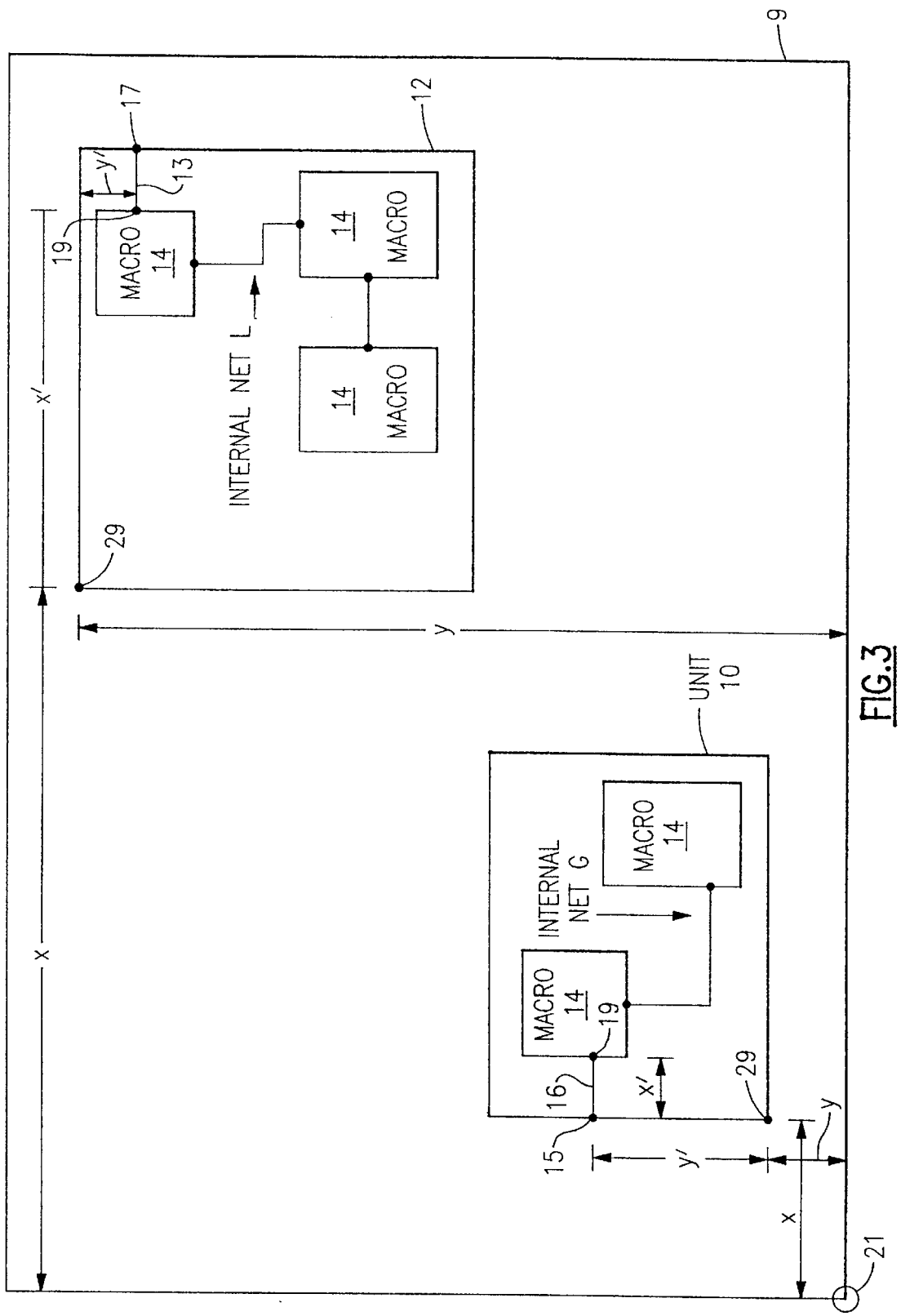

At block 707 the program calculates the top level chip coordinates (x,y) for each pin (unit and macro) location from the data previously entered. An inspection of FIG. 3 provides a visual illustration of the translation operation with unit reference points 29 referenced to top level chip reference point 21 and the macro and pin locations referenced to the unit references 29, which are then translated to the chip reference by a suitable geometry translation routine.

At block 708 the program generates a flat design file 709. It also generates a net routing file 710, which is used for net name translation cross-reference to be read by other programs that manipulate the routing data.

In the resulting file, flat design file 709, there are external nets that pass through unit pins (i.e. nets which cross unit boundaries) as the net connects to macro pins, and there are nets that contain only macro pins (i.e. internal nets completely contained inside a unit). The process here is concerned with the placement of unit pins so that only nets that pass through unit pins need be analyzed in the following steps for the appropriateness of unit pin locations in terms of minimizing net lengths. However, for convenience, in a specific embodiment of the invention, all nets are analyzed. Each file contains data for each net in the design, identifying the component name and its instance name, unit placement locations including rotation attributes, pin names, and top level chip x,y coordinates for the shape rectangles that are the pins. As will be appreciated by those skilled in the art, a physical pin can be, and is, implemented in several shape rectangles. The extra shape rectangles for a single pin provide connection flexibility for the wiring program. The program in calculating a Minimum Spanning Distance for a net before routing, does not have as an input which portion or shape of the pin will be selected by the routing program for connection to that pin. Therefore, all shapes are counted as pins when the minimum spanning tree calculation is made. Since the difference between the minimum spanning tree calculation with and without unit pin is used to identify problem unit pin placements, the uncertainty in which shape would be selected by the routing program cancels out.

Figure 8:
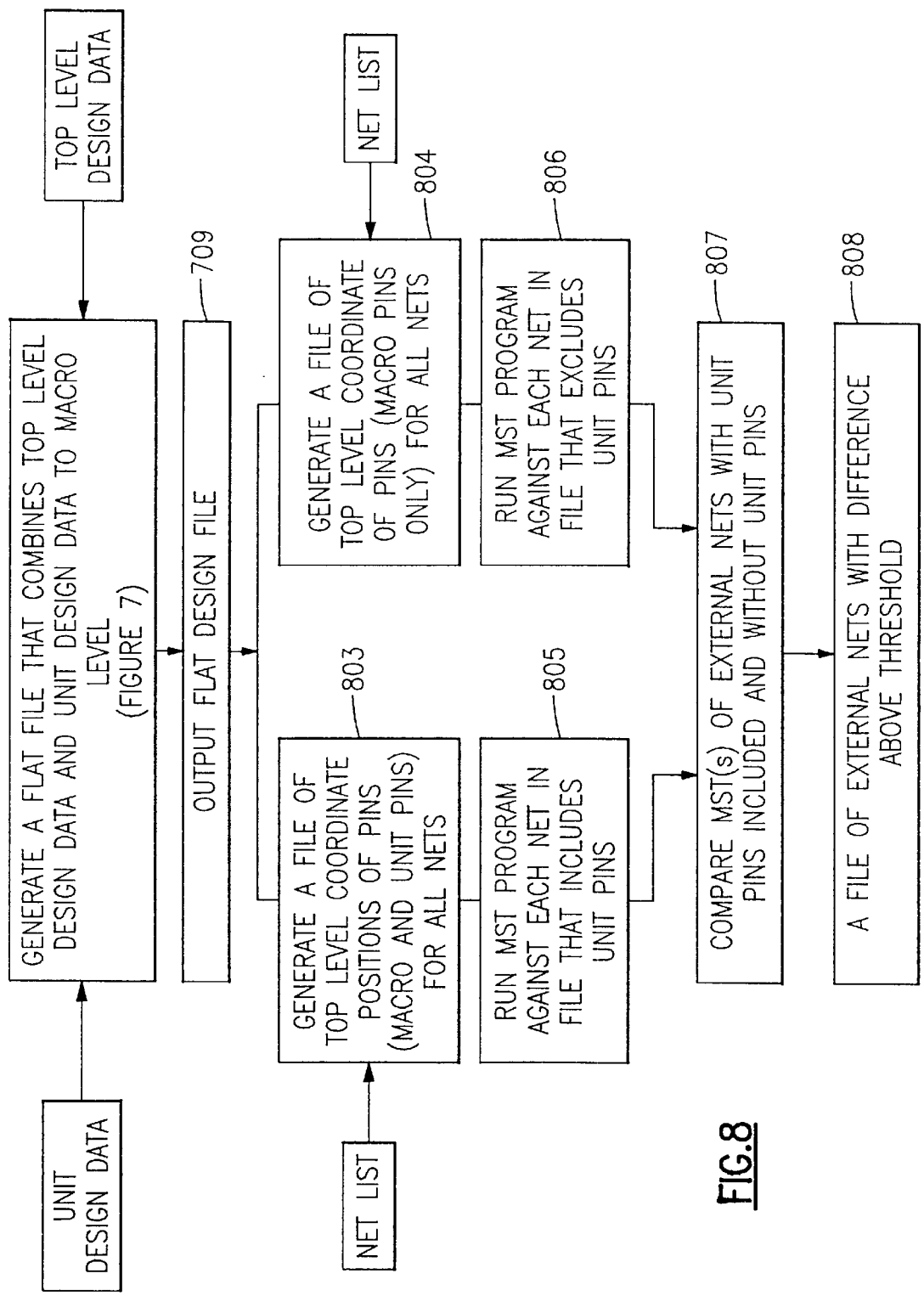
FIG. 8 is a flow diagram that incorporates the flat file data of FIG. 7 and identifies sub-optimally placed unit pins.

Referring now to FIG. 8, the initial step in determining sub-optimum pin placement is to generate the net file and the flat file described in connection with FIG. 7. The flat file in effect brings the unit macro and pin data up to the top level chip design. As previously explained, the flat design program generates two output files. File 709, a flat design file (e.g. on the order of 2 to 4 million records for a typical VLSI chip) contains the net names, macro and unit pins in each net, macro and unit physical data (i.e. pin shapes, and blockage shape data), and macro and unit physical placement data. Another file, a net routing file 710, contains the net routing data for the top level VLSI chip design and for the macros.

The net list is run against flat design file 709 to generate a file 803 of top level pin positions including unit and macro pins as a similar file 804 with macro pin positions only.

Next, a suitable program to calculate a minimum net length (e.g. an MST program or a Steiner Minimal Tree program) is run twice against each net in the design. Once, at step 805, against file 803 that includes unit pins, and once, at step 806, against file 804 that does not include unit pins. At step 807, a difference in minimum net length is calculated for each run by subtracting the length calculated with unit pins from the length calculated without unit pins. Of course, the difference is zero for nets that do not extend beyond a unit, and thus have no unit pins.

The output of the methodology is a text file 808 containing the net names, number of pins per net with and without unit pins, MST values with and without pins, and the difference between these two MST values. For each net in which the difference exceeds a threshold value, which threshold value typically takes into account design tradeoffs, the unit designers relocate the unit pins in their unit design. Typical threshold values are on the order of one to two millimeters; for example, early in the design two millimeters, and one millimeter as the design progresses.

Figure 9:
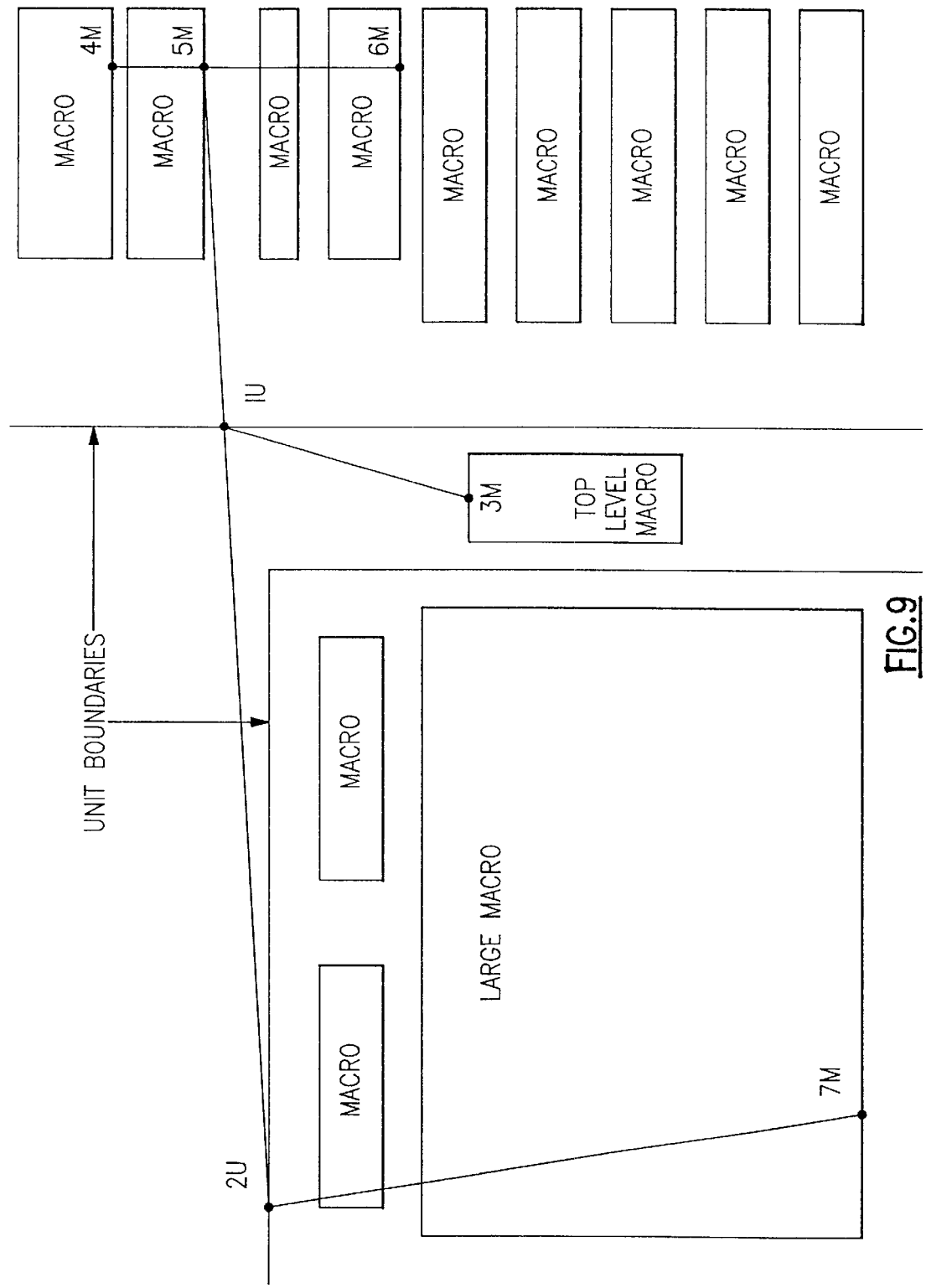
FIG. 9 is a fragmentary, top, plan view of the net (SIG 1) explained in connection with Table 1.

Table 1 is an example of the data compiled for the external nets referred to as SIG1 in FIG. 9. Table 1 contains a summary of the detailed MST results for the sample net, which was found to have bad unit pin placements.

The pins are labeled with their pin number followed by "U" for unit pins or "M" for macro pins. The third column is shape number, which is described early. The fourth column is the x,y center of the macros pin shape. FIG. 9 illustrates the net SIG 1. Here it should be noted, pin 3M is a pin on a top level macro (i.e. a macro that is not part of a unit). The final results from Table 1 are that the first sample net (SIG1) has an excess unrouted length of 5960. SIG1 has a large percentage increase in the unrouted length of 5960/14360=41.5%.

TABLE 1

| SIG1 | Pin | Type | Shape | X | Y | Result |
|---|---|---|---|---|---|---|
| (1. WITH unit pins) | 1 | U | 1 | 42420, | 19510 | 20320 |
|  | 2 | U | 2 | 35670, | 19830 |  |
|  | 3 | M | 3 | 41560, | 18330 |  |
|  | 4 | M | 4 | 44310, | 21979 |  |
|  |  |  | 5 | 44320, | 21070 |  |
|  | 5 | M | 6 | 44310, | 19760 |  |
|  |  |  | 7 | 44320, | 19760 |  |
|  | 6 | M | 8 | 44310, | 18230 |  |
|  |  |  | 9 | 44320, | 18230 |  |
|  | 7 | M | 10 | 36630, | 14620 |  |
|  |  |  | 11 | 36650, | 14620 |  |
|  |  |  | 12 | 36660, | 14620 |  |
| (2. WITHOUT unit pins) | 3 | M | 3 | 41560, | 18330 | 14360 |
|  | 4 | M | 4 | 44310, | 21070 |  |
|  |  |  | 5 | 44320, | 21070 |  |
|  | 5 | M | 6 | 44310, | 19760 |  |
|  |  |  | 7 | 44320, | 19760 |  |
|  | 6 | M | 8 | 44310, | 18230 |  |
|  |  |  | 9 | 44320, | 18230 |  |
|  | 7 | M | 10 | 36630, | 14620 |  |
|  |  |  | 11 | 36650, | 14620 |  |
|  |  |  | 12 | 36660, | 14620 |  |
|  |  |  |  | 20320 − 14360 = 5960 |  |  |

In one embodiment of the invention, the invention, the designer or designers then view graphically, in isolation, these nets that have been identified as having poor pin placement and reposition one or both unit pins to shorten the external net length. For example, with reference to FIG. 4, viewing the net SIG 9 in isolation, unit designers for units 10 and 12 would relocate unit pin 15 to the upper boundary of unit 10 at 15' and pin 17 to the other side of unit 12 at 17', for example.

Figure 5:
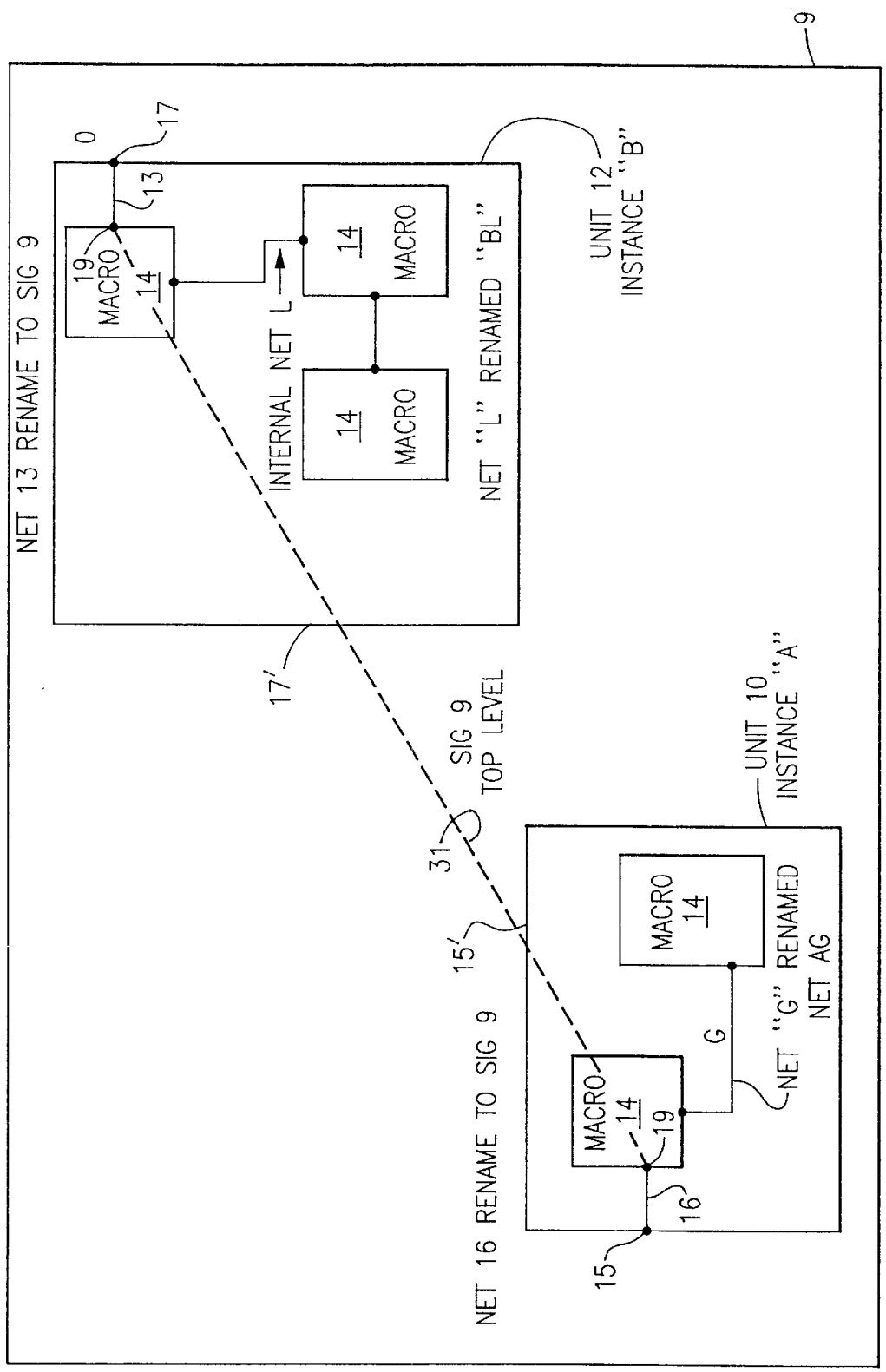
FIGS. 5 and 6 are respectively replications of FIG. 1 showing reassigned pin placements.
Figure 10:
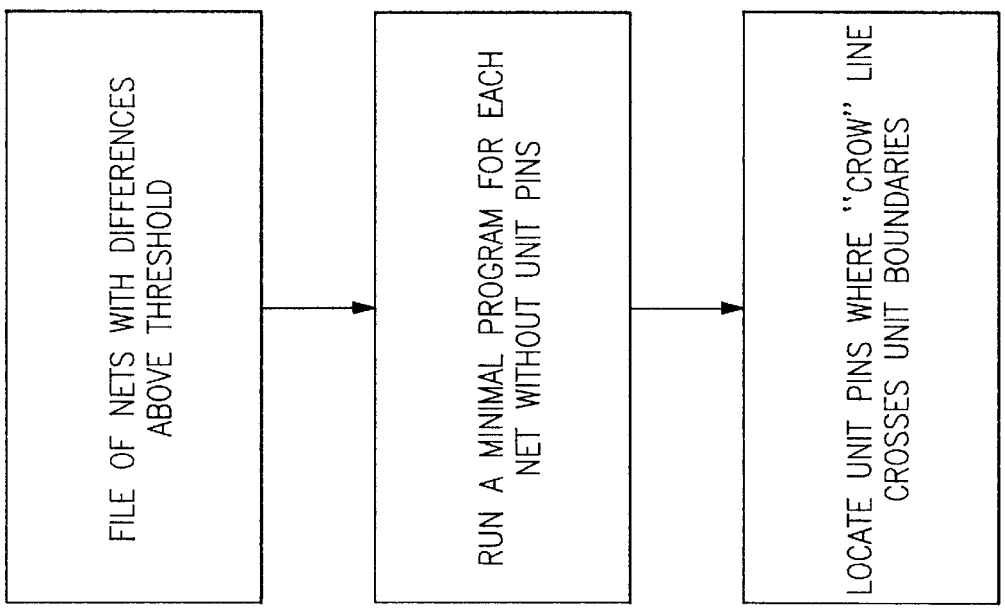
FIG. 10 is a flow diagram of one method for repositioning unit pins identified in FIG. 9.

Referring now to FIG. 10, in another embodiment of the invention, an MST program, or similar program such as the Steiner program, is run for each net above the threshold without unit pins assigned. As Illustrated in FIG. 5 where the "crow" 31 line generated by the MST program crosses the unit boundaries at 15' and 17' denotes locations where the pin can be relocated in order to reduce the net length.

Figure 6:
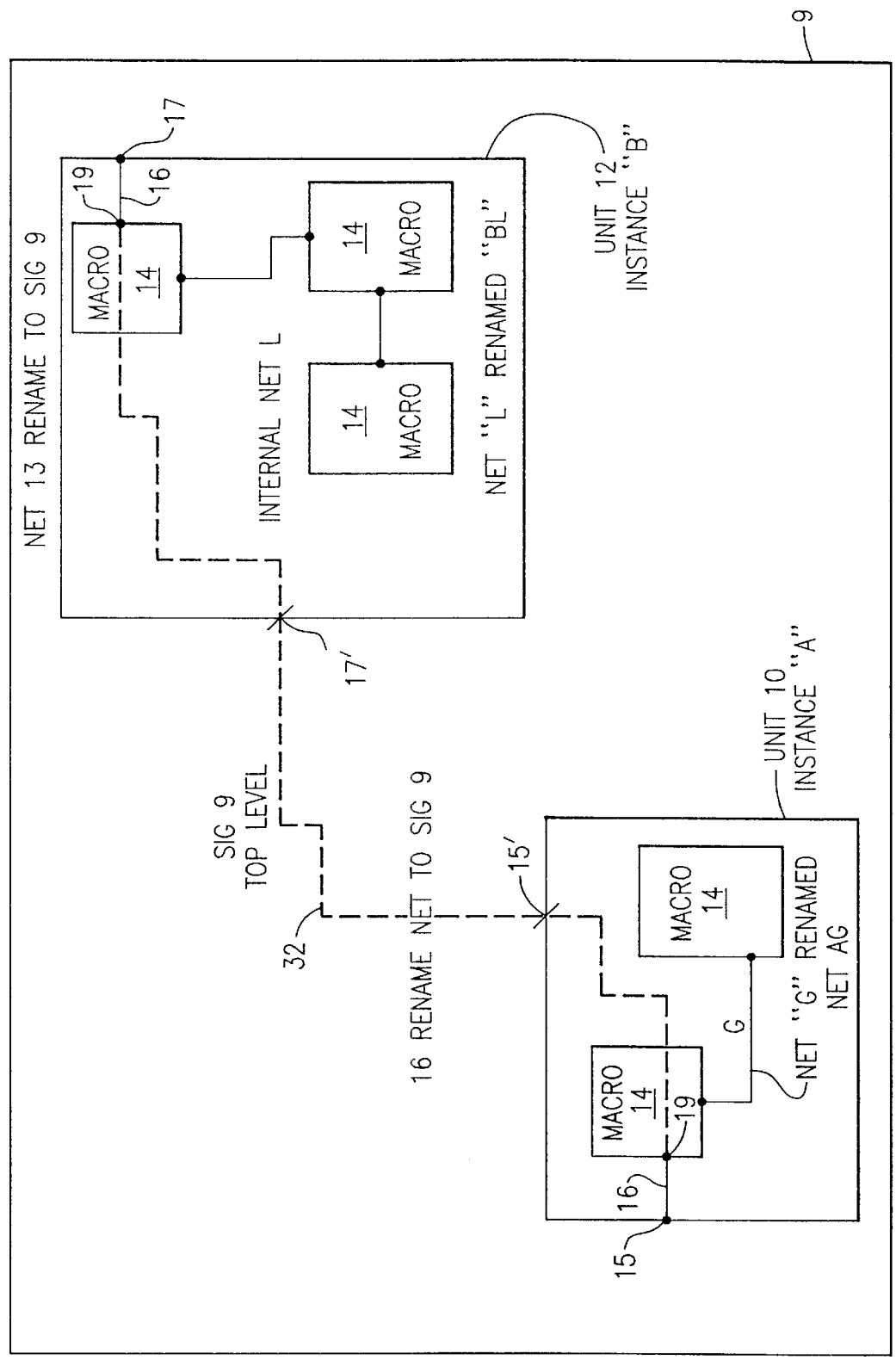
Figure 11:
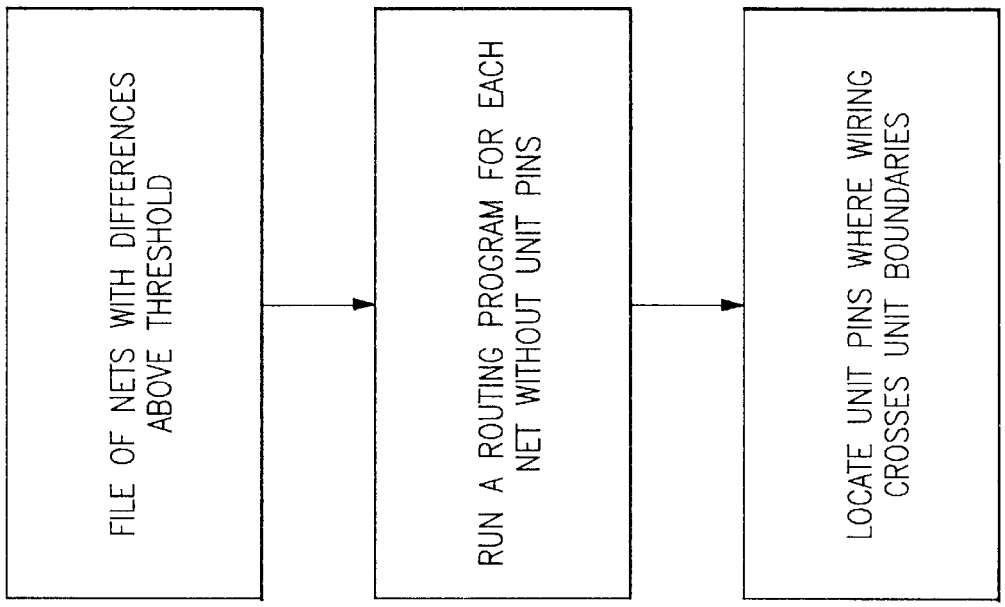
FIG. 11 is a flow diagram of another method for repositioning unit pins identified in FIG. 9.

Referring now to FIG. 11 in yet another embodiment similar to that shown in FIG. 10, a wire routing program is run against each net above the threshold without unit pins assigned. As illustrated in FIG. 6, where the wiring path 32 generated by the wiring program crosses the unit boundaries at 15" and 17" denotes locations where the unit pins can be relocated in order to reduce net length.

While the preferred embodiment to the invention has been described, it will be understood that those skilled in the art, both now and in the future, may make various improvements and enhancements which fall within the scope of the claims which follow. These claims should be construed to maintain the proper protection for the invention first described.

What is claimed is:

1. A method for positioning of unit pins in a VLSI design, including the steps of:

(a) identifying, in a VLSI chip design, external nets with unit pins located in a sub-optimal position with respect to minimum net length, by;
  determining a minimal net length for any external net with unit pins assigned;
  determining a minimal net length for an external net without unit pins assigned;
  calculating a difference between said minimal net length for an external net with unit pins assigned and said minimal net length for an external net without unit pins assigned;
  identifying as an external net with unit pins in a sub-optimal position, units nets where said differences exceeds a threshold;
(b) running a routing program on each external net identified in the identifying step positioning unit pins for said net in accordance with where the minimal line crosses a unit boundary;
(c) positioning unit pins for said net in accordance with where the wire route crosses a unit boundary.

2. A method for positioning of unit pins in a VLSI design, including the steps of:
(a) identifying, in a VLSI chip design, external nets with unit pins located in a sub-optimal position with respect to minimum net length, by;
  generating a flat data file that includes internal nets and external nets including macro pin positions and unit pin positions referenced to a common coordinate system;
  determining a minimal net length for any external net with unit pins assigned;
  determining a minimal net length for an external net without unit pins assigned;
  calculating a difference between said minimal net length for an external net with unit pins assigned and said minimal net length for an external net without unit pins assigned;
  identifying as an external net with unit pins in a sub-optimal position, units nets where said differences exceeds a threshold;
(b) running a routing program on each external net identified in the identifying step positioning unit pins for said net in accordance with where the minimal line crosses a unit boundary;
(c) positioning unit pins for said net in accordance with where the wire route crosses a unit boundary.

3. A method for positioning of unit pins in a VLSI design as in claim 1 including the further step of displaying, in isolation, each external net identified in said identifying step.

4. A method for positioning of unit pins in a VLSI design as in claim 2 including the further step of displaying, in isolation, each external net identified in said identifying step.

5. A method for positioning of unit pins in a VLSI design as in claim 1 wherein said step of determining a minimal net length for external nets with unit pins assigned and said step of determining minimal net length for external nets without unit pins assigned runs a minimum spanning tree program against external nets with unit pins assigned and against external nets without unit pins assigned.

6. A method for positioning of unit pins in a VLSI design as in claim 2 wherein said step of determining a minimal net length for external nets with unit pins assigned and said step of determining minimal net length for external nets without unit pins assigned runs a minimum spanning tree program against external nets with unit pins assigned and against external nets without unit pins assigned.

7. A method for positioning of unit pins in a VLSI design as in claim 1 wherein said step of determining a minimal net length for external nets with unit pins assigned and said step of determining minimal net length for external nets without unit pins assigned runs a Steiner minimal tree program against external nets with unit pins assigned and against external nets without unit pins assigned.

8. A method for positioning of unit pins in a VLSI design as in claim 2 wherein said step of determining a minimal net length for external nets with unit pins assigned and said step of determining minimal net length for external nets without unit pins assigned runs a Steiner minimal tree program against external nets with unit pins assigned and against external nets without unit pins assigned.

9. A method for positioning of unit pins in a VLSI design as in claim 2 wherein said generating step includes assigning the top level net name to internal unit nets that are connected to unit pins and that are part of the named net.

10. A method for positioning of unit pins in a VLSI design as in claim 2 wherein said generating step includes converting unit pin coordinates and macro pin coordinates to a common top level coordinate system.

11. A method for positioning of unit pins in a VLSI design as in claim 2 wherein said generating step includes assigning the top level net name to internal unit nets that are connected to unit pins and that are part of the named net; and converting unit pin coordinates and macro pin coordinates to a common top level coordinate system.

* * * * *